United States Patent
Chen Hsu et al.

(10) Patent No.: US 6,483,764 B2
(45) Date of Patent: Nov. 19, 2002

(54) DYNAMIC DRAM REFRESH RATE ADJUSTMENT BASED ON CELL LEAKAGE MONITORING

(75) Inventors: Louis Lu Chen Hsu, Fishkill, NY (US); Gerd Frankowsky, Hohenkirchen-Sigertsbrunn (DE); Oliver Weinfurtner, Gilching (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/761,045

(22) Filed: Jan. 16, 2001

(65) Prior Publication Data

US 2002/0136075 A1 Sep. 26, 2002

(51) Int. Cl.7 ............................................... G11C 7/00
(52) U.S. Cl. ........................................ 365/222; 365/203
(58) Field of Search .................................. 365/222, 203, 365/230.03, 189.02, 189.07, 189.08

(56) References Cited

U.S. PATENT DOCUMENTS 6,229,747 B1 * 5/2001 Cho et al. .................... 365/222
6,252,816 B1 * 6/2001 Mullarkey ................... 365/222
6,266,272 B1 * 7/2001 Kirihata et al. ........... 365/185.08

\* cited by examiner

*Primary Examiner*—Richard Elms
*Assistant Examiner*—Hien Nguyen

(57) ABSTRACT

A novel DRAM refresh method and system and a novel method of designing a low-power leakage monitoring device. With the DRAM refresh method, the time is adjusted based directly on the cell leakage condition. The method of designing a low-power leakage monitoring devices uses a memory cell identical to the cells in the real array. This monitor cell is designed so that it will represent the average cell or the worst cell leakage condition. If the leakage is severe, the refresh cycle time is significantly reduced, or halved. If the leakage level is very low or undetectable, then the refresh cycle time is significantly increased, or doubled. If the leakage is moderate, or in the normal range, the refresh time is optimized, so that the power consumption used for DRAM refresh is minimized. The advantages of this method over the existing method, that is, adjusting the refresh cycle time based on chip temperature include (1) the contributions from non-temperature dependent leakage factors are taken into consideration, (2) the present invention does not require different process steps, or extra process costs to integrate such device in the chip, and (3) the present invention is a straight forward method, the monitor cell does not need any calibration. In addition, its leakage mechanism and reliability concern are all identical to the cells in a real array.

13 Claims, 9 Drawing Sheets

THE CONVENTIONAL DIFFERENTIAL AMPLIFIER
ACTING AS AN A/D CONVERTER

LEAKAGE MONITOR CONTROL CIRCUIT
FOR REFRESH RATE ADJUSTMENT

FIG. 5
HSPICE SIMULATION OF THE LEAKAGE MONITOR DEVICE
4A. CELL NODE VOLTAGE IS DANGEROUSLY LOW
Vnode=1.24V
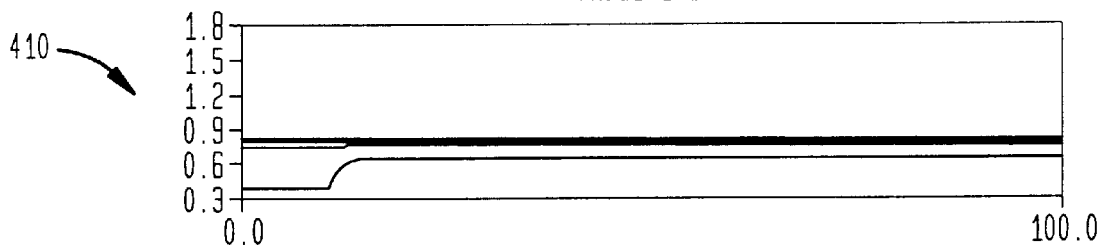
4B. CELL NODE VOLTAGE IS LOW
Vnode=1.34V
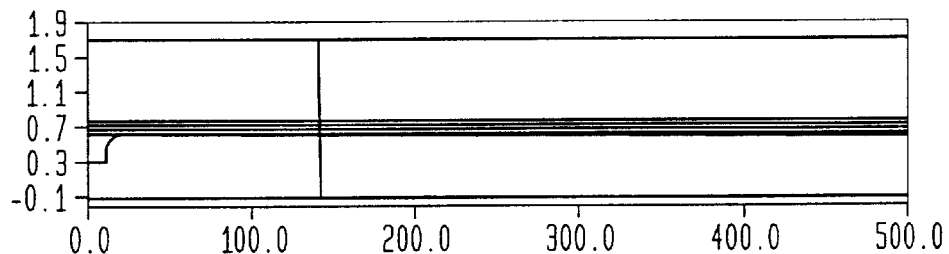
4C. CELL NODE VOLTAGE IS ACCEPTIBLE
Vnode=1.44V
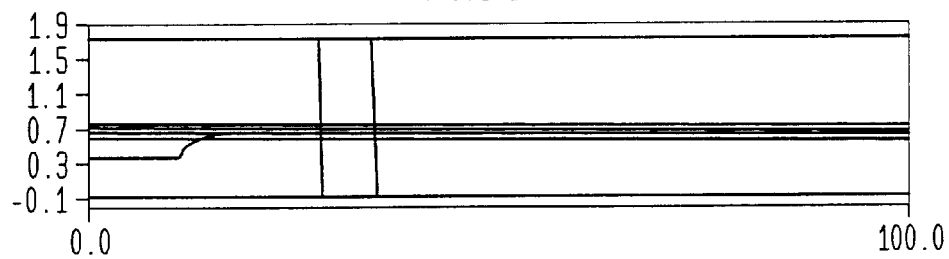
4D. CELL NODE VOLTAGE MAINTAINS HIGH
Vnode=1.54V
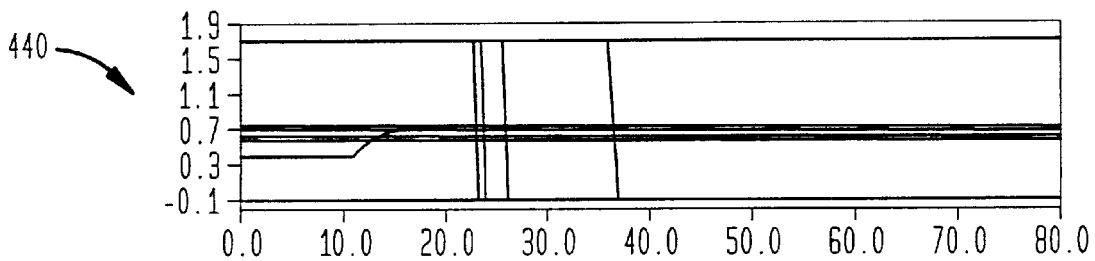

REFRESH CIRCUIT BLOCK DIAGRAM

REFRESH PULSE TIMING DIAGRAM

BASE CLOCK GENERATOR

REFRESH CYCLE TIME ADJUSTMENT THROUGH
DECODING CAPACITOR COMPONENTS

INTELLIGENT REFRESH FOR DRAM CHIP

INTELLIGENT REFRESH FOR MULTI-BANK DRAM

INTELLIGENT REFRESH FOR EMBEDDED DRAM

INTELLIGENT REFRESH FOR DRAM MODULE

FLOW CHART OF INTELLIGENT REFRESH CONCEPT

DYNAMIC DRAM REFRESH RATE ADJUSTMENT BASED ON CELL LEAKAGE MONITORING

BACKGROUND OF THE INVENTION

1. Field of the Invention

This invention generally relates to methods and systems to adjust the refresh rates for DRAMs. More specifically, the invention relates to such methods and systems that are based on direct measurements of the cell leakage rates of the DRAMs.

2. Prior Art

One major disadvantage of a dynamic random access memory (or DRAM) is that the cells must be refreshed for every certain period of time, or otherwise the data stored in the cells will become invalid. This is because the charges stored in the cells constantly leak away. There are many leakage paths for a storage capacitor. For example, these capacitors could leak through the devices's diffusion junction areas, through the channel of a transfer gate, or even through the gate itself by tunneling mechanism. The leakage is a function of a number of factors, including chip temperature, process variation, and voltage fluctuations.

As the device dimensions are scaled down, the magnitude of leakage could also be proportionately reduced due to the reduced junction area. For example, if the refresh time for a 16 M DRAM is about 32 ms, the refresh rate can be reduced to half that when similar technology is used to fabricate a 64 M DRAM. However, process variations, for instance, the channel length, the threshold voltage, junction implant, etc. can be slightly different from wafer to wafer, or even across a wafer. For a large chip such as today's 1Gb or 4 Gb DRAMs, such variations could even occur within a chip.

In addition, when a DRAM is embedded into a processor chip, for example, lower power operation becomes critical. During active mode, when the processor is fully active, the chip temperature can surge to a temperature much higher than that of the stand alone DRAM chip. At such times, in order to preserve the data integrity, higher refresh rates must be implemented. However, when the chip is in a stand-by mode or a sleep mode, the chip temperature could cool significantly. At these times, since the charge leaks less, it is desirable to increase the refresh cycle time so as to reduce the refresh power consumption.

U.S. Pat. No. 5,278,796 teaches a method of using a discrete temperature sensing device to save DRAM power by adjusting the refresh rate based on the temperature of the DRAM array. The temperature sensor is placed in proximity to the DRAM and outputs a voltage that is proportional to the DRAM temperature. A voltage divider is used so that for each increment of 140 mV (or increase in chip temperature by 14 degrees C.), the refresh cycle time is halved.

U.S. Pat. No. 5,446,696 also refers to installation of a temperature sensor in the processor or memory controller to measure the ambient temperature so as to optimize the DRAM refresh time.

U.S. Pat. No. 5,748,328 describe a DRAM array that also has a temperature sensor that generates a signal that indicates chip temperature. A control circuit receives the signal from the temperature sensor and responsively generates a refresh signal to a refresh circuit according to a given ROM look-up table. The table provides multiple entries that indicate the desired refresh rates for particular temperatures.

Therefore, prior art exists that refers to the concept of adjusting DRAM refresh cycle time according to chip temperature. Among this prior art, either discrete or integrated temperature sensor(s) are used to measure the ambient, process or DRAM temperatures. Such temperature information is fed to a refresh circuit to determine the refresh cycle period, so that refresh power is reduced.

However, there are several important disadvantages of this approach. For example, temperature may not be the only factor that causes the charge in the DRAM cells to leak. Other causes, such as process variations, defect density, voltage fluctuation, noise coupling, etc. will all contribute to the cell leakage mechanism. Moreover, monitoring temperature to adjust the refresh rate requires an accurate and reliable temperature sensor. Once fabricated, the sensor must be calibrated, especially the integrated sensor. If the sensors are not accurate, the refresh rate will be out of control. Further, the degradation of sensor quality during the chip life time is also an unknown factor. Important issues need to be investigated, such as whether the sensor survives the burn-in test, and how the sensor material is compatible with the silicon substrate.

Another important disadvantage of the above-discussed prior art approach is the extra cost involved when integrating a temperature sensor on the chip. Normally, extra process steps with different material are required. For example, U.S. Pat. No. 5,154,514 discloses an on-chip temperature sensor using a Schottky barrier diode made with wide-bandgap (e.g. 3,0 V) metal-oxide semiconductor.

SUMMARY OF THE INVENTION

An object of this invention is to provide an improved leakage monitor device and method for DRAMs.

Another object of the present invention is to design a DRAM leakage monitor so that it is pre-charged when the chip is entering the self-refresh cycle.

A further object of this invention is to evaluate a leakage monitor cell and to convert the information on the remaining charge level in the cell into digital output signals that will determine the refresh rate for the following refresh cycle.

Another object of the present invention is to provide an individual monitor cell and refresh circuit set for each bank of a DRAM chip. An object of this invention is to provide a low-power leakage monitoring circuit.

These and other objectives are attained with a novel DRAM refresh method and system and with a novel method of designing a low-power leakage monitoring device. With the DRAM refresh method, the refresh cycle time is adjusted based directly on the cell leakage condition. The method of designing a low-power leakage monitoring devices uses a memory cell identical to the cells in the real array. This monitor cell is designed so that it will represent the average cell or the worst cell leakage condition. If the leakage is severe, the refresh cycle time is significantly reduced, or halved. If the leakage level is very low or undetectable, then the refresh cycle time is significantly increased, or doubled. If the leakage is moderate, or in the normal range, the refresh time is optimized, so that the power consumption used for DRAM refresh is minimized.

The advantages of this method over the existing method, that is, adjusting the refresh cycle time based on chip temperature include (1) the contributions from non-temperature dependent leakage factors are taken into consideration, (2) the present invention does not require different process steps, or extra process costs to integrate such device in the chip, and (3) the present invention is a straight forward method, the monitor cell does not need any calibration. In addition, its leakage mechanism and reliability concern are all identical to the cells in a real array.

With a preferred embodiment, the leakage monitor device is built physically adjacent to the DRAM array, using the identical process steps, material, and similar device structure. Therefore, this monitor cell should have identical or slightly worse leakage characteristics compared to any of the real cells in the array. The reason that this monitor cell can also be built with a slightly leakier situation than the real cells is that it may represent the worst cell in the array. It can also be built with multiple cells with proper bit-line loading so that the leakage level can be averaged out.

In accordance with one aspect of this invention, the monitor cell is designed so that it is pre-charged when the chip is entering the self-refresh. Then, the monitor cell is evaluated periodically, for example, once every refresh cycle. Here, every cycle means after all the word lines in the array are refreshed once. Since the leakage condition could be changed quite drastically, a proper and conservative evaluation period is recommended. After the evaluations, the monitor cell is automatically recharged again and is held for the following cycle evaluation, and so on.

Another aspect of the invention is to convert the information on the remaining charge level in the cell into digital output signals which will determine the refresh rate for the following refresh cycle. If the leakage level is very high, a gross adjustment to speed up the refresh rate is issued. In contrast, if the leakage rate is extremely low, a gross adjustment to slow down the refresh rate is issued. If the leakage rate is moderate and within a reasonable range, multiple-steps of minor adjustments on the refresh rate are issued.

In accordance with another aspect of the present invention, an individual monitor cell and refresh circuit set are provided for each bank of a DRAM chip. As a result, each bank can adjust its refresh rate independently based on its local leakage information. Further, monitor cells and refresh circuits sets can be provided on each of the arrays of an embedded memory chip. Such monitor cells can also be built on every chip installed on a module acting as a leakage censor of the chips.

In addition, preferably, the leakage monitoring circuits disclosed herein are low-power circuits. The total power used for these circuit is less than 10 uA, and the power saved by using this feature will be in the mA range, also depending on the applications.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 5 depicts the simulated output of the leakage monitor device under various conditions.

DETAILED DESCRIPTION OF THE PREFERRED EMBODIMENTS

Figure 1:
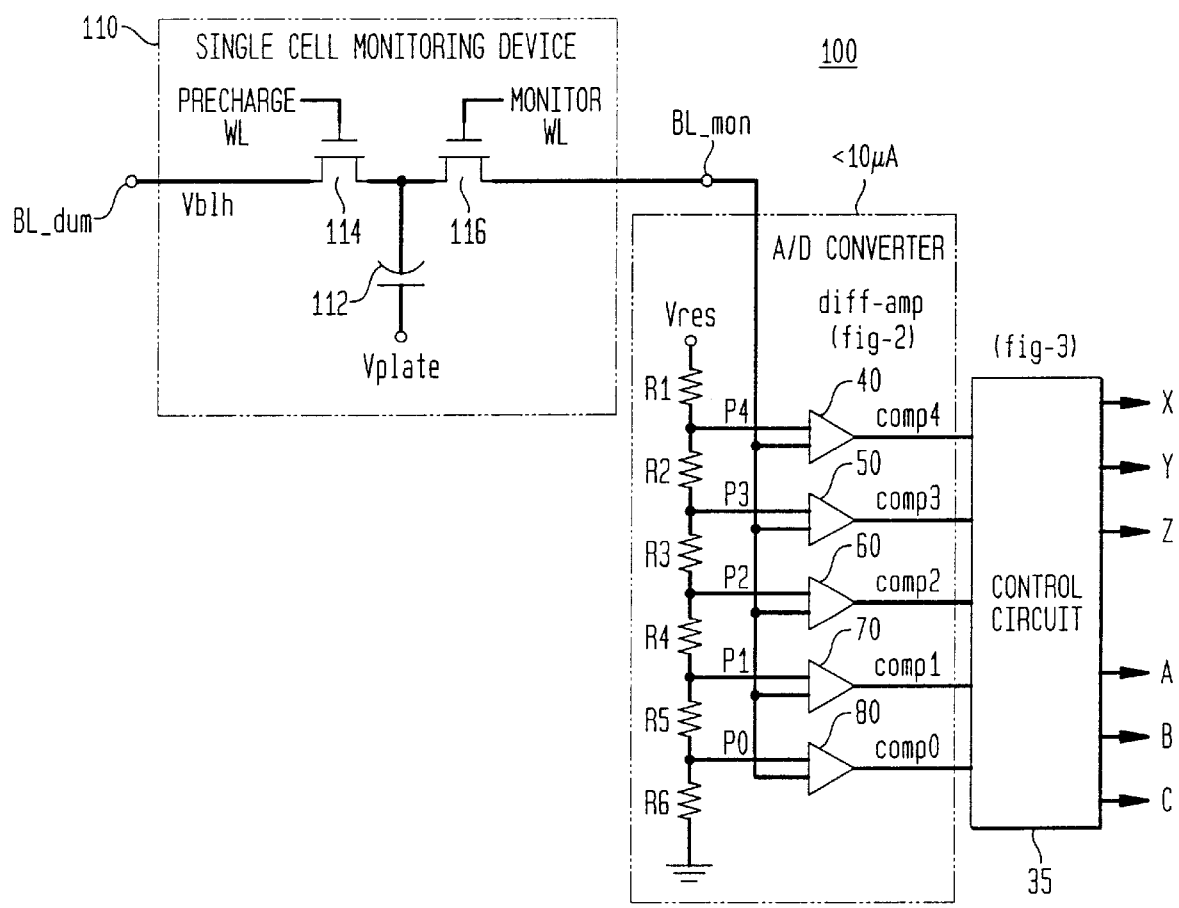
FIG. 1 illustrates a first embodiment of a DRAM cell leakage monitoring system having a single cell monitor device embodying this invention.

FIG. 1 illustrates a first embodiment of a DRAM cell leakage monitoring system 100. monitor cell 110 comprises one DRAM cell with a capacitor 112 and two transfer gates 114 and 116. The first NMOS gate 114 is used to precharge or recharge the cell capacitor 112 through a dummy bit-line (BL_dum). After precharging, the dummy bit-line is kept at bit-line high level (or Vblh). The second transfer NMOS 116 is used for evaluating the charge stored in the capacitor 112. An A/D converter 120 comprises a resistive voltage divider, which includes multiple resistor components, R1-R6 connected in series, and several differential amplifiers, A1–A5. The output node, BL_mon, from the monitor device 110 is connected to the first legs of all the differential amplifiers A1–A5. The intermediate nodes P4-P0 between the resistors R1 and R2, R2 and R3, R3 and R4, R4 and R5, and R5 and R6, are connected to the second legs of t differential amplifiers A1–A5 respectively. The output pins of the differential amplifiers are referenced at comp4, comp3, comp2, comp1 and comp0. As will be understood by those of ordinary skill in the art, more or less than five stages of the level comparisons can be used. With the embodiment shown in FIG. 1, a five stage comparison scheme is used as an example.

The resistor chain is connected to a voltage supply vres (for example, equal to 1.6 V). The size of each resistor component is carefully chosen so that cell leakage can be properly monitored. More specifically, when the voltage level of a "high" signal stored in a cell is lower than a certain critical level, the cell signal becomes invalid. As an example, in order to have a valid "high" read out from a cell at least about 100 mV of signal margin is required between two complementary bit lines. This is needed so that the sense amplifier is able to correctly differentiate and amplify the signal. These considerations determines the lowest "high" voltage of a cell. As an example, the bit line high level Vblh=1.6 V, the bit-line equalization level Vbleq=0.8 V, the cell capacitance is 40 fF, and the bit-line and sense amplifier parasitic capacitance is 150 ff With these values, in order to get 100 mV of signal margin between a complementary bit part, the cell must have at least 1.275 V during evaluation. This determines the resistor R6 value.

The maximum voltage of the cell will be the fall Vblk (or 1.6 V), if there is no leakage at all, after one refresh cycle. This determines the voltage at P4, or the sum of the resistor values of R2 +R3+R4+R5+R6. Anything between the maximum and the minimum voltage levels can be divided evenly into three or more stages, which determines the resistor values of R2 to R5. In order to make sure that the monitor cell represents the worst cell of the array, so that the estimated refresh rate will satisfy the worst case condition, the monitor cell may be purposely built with two transfer gates so that the cell will have higher leakage magnitude through the channel of two transfer devices as well as junctions of source to substrate of both devices.

Figure 2:
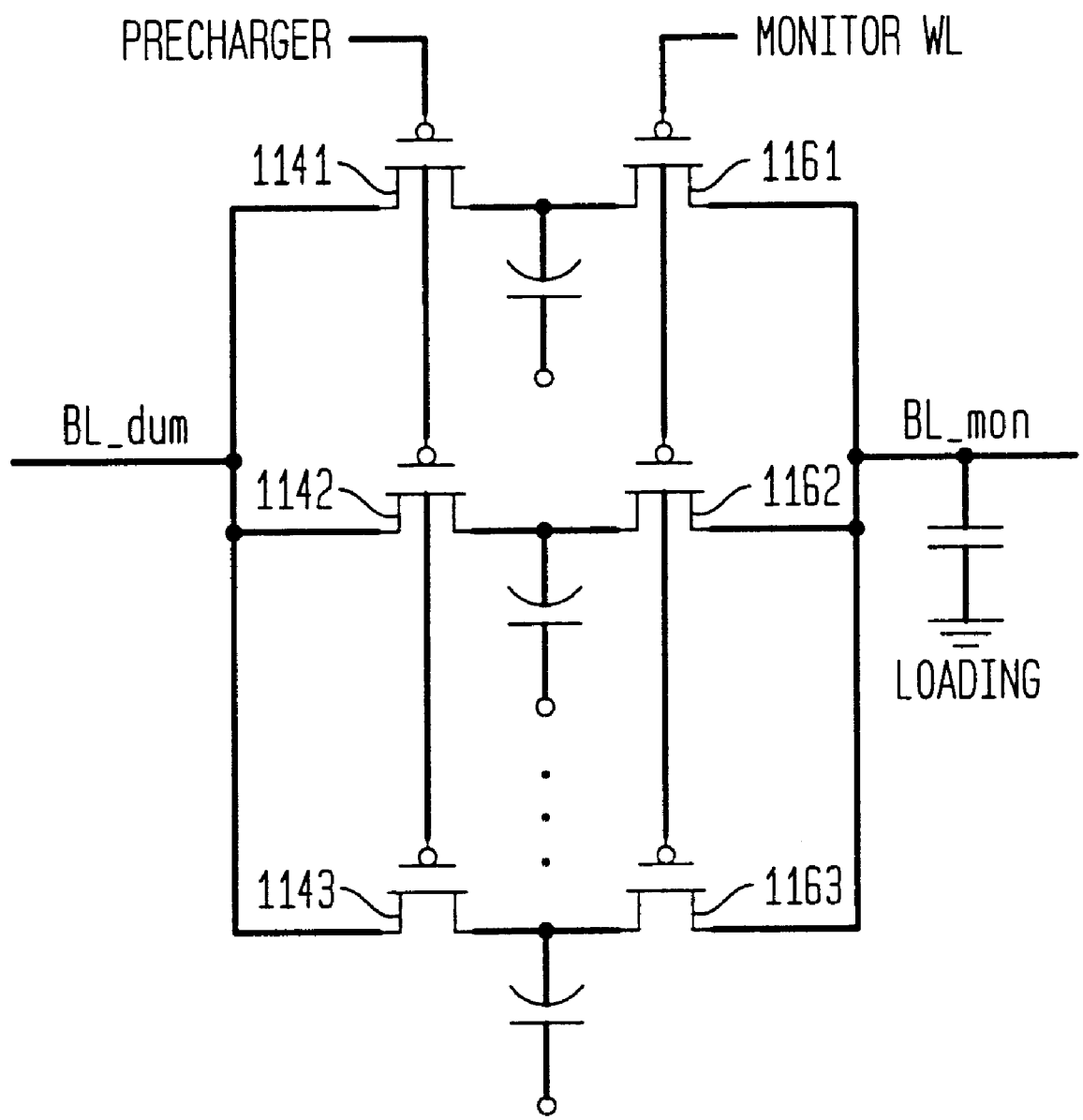
FIG. 2 illustrates a group cell monitor device.

FIG. 2 is a schematic diagram of a group cell monitor device which comprises more than one single cell monitor device and arranged in parallel. This is to average out odd cell effects. Here, BL_mon should be loaded accordingly.

Once the cell charge is monitored and digitized, the output signals of comp0-comp4 are fed into a control circuit 300.

Figure 4:
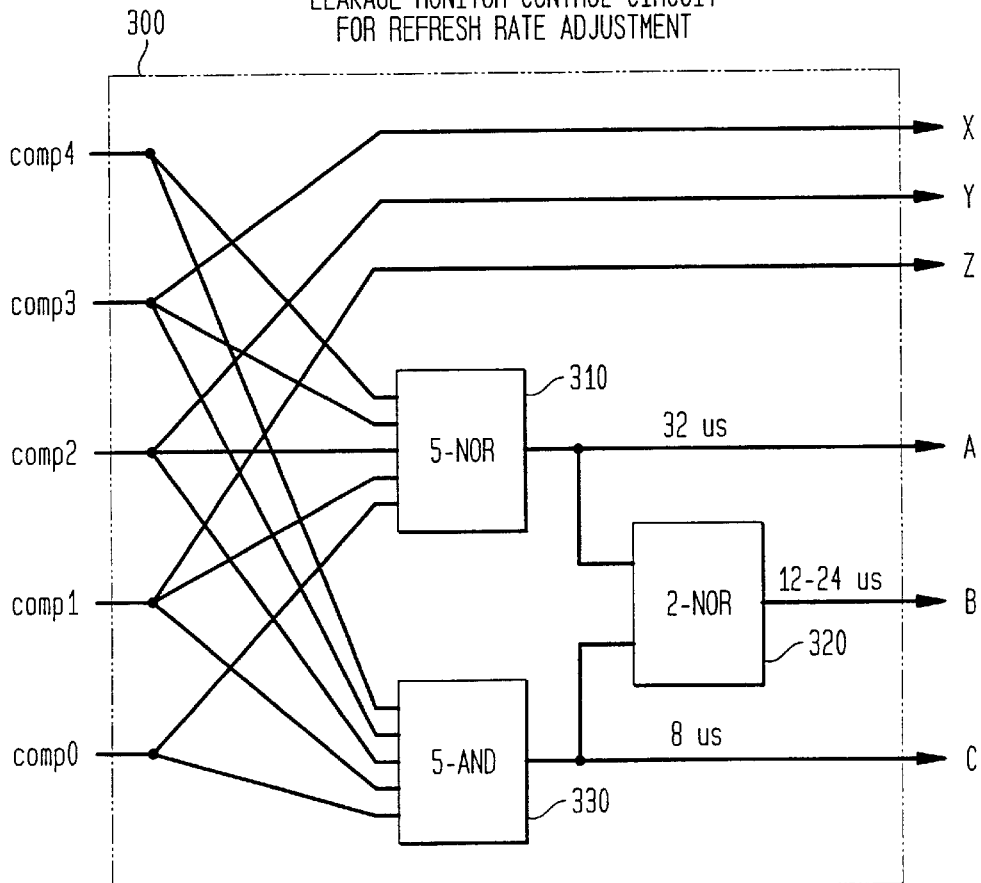
FIG. 4 shows an example of a leakage monitor control circuit that may be used in the practice of the present invention.

The circuit schematic of this control circuit is shown in FIG. 4 and described in detail below.

Figure 3:
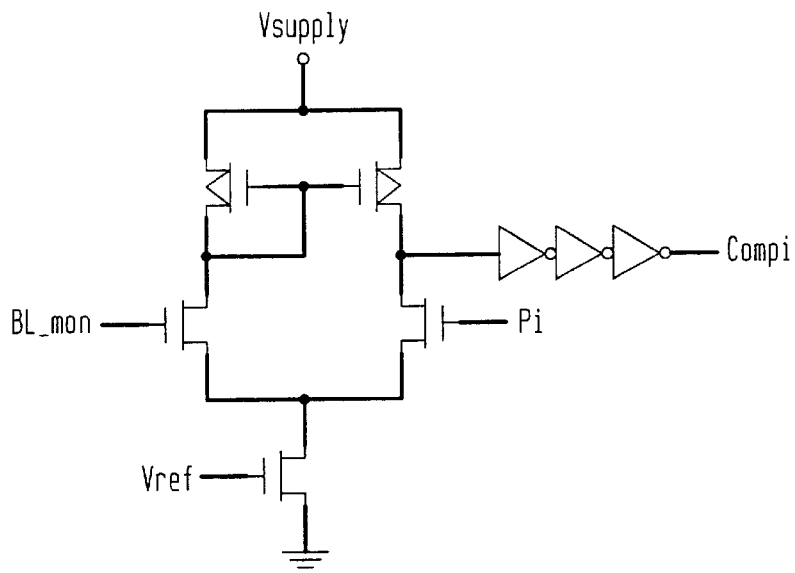
FIG. 3 is a schematic diagram of a conventional differential amplifier.

FIG. 3 is a schematic diagram of a conventional differential-amplifier. As mentioned earlier, the BL_mon from the monitor cell 110 is fed to one leg, while the Pi (I=0–4) node is fed to the other leg. A reference voltage Vref is used to bias the current source of the differential amplifier. When the voltage at the Pi node reaches BL_mon, the output, Compi, of the differential amplifier swings from high to low.

FIG. 4 is an example of a control circuit 300, which comprises a five-input NOR gate 310, a five input AND gate 330, and a two-input NOR gate 320. The case considered as the worst case is when all the output signals Comp0–Comp4 are all "high," as shown at 410 in FIG. 5. At this moment, the output of gate 330, or C, will be at "high," and the refresh cycle time will be set, for example, at 8 us. However, if all the output signals from the A/D converter are at "low," as shown at 440 in FIG. 5, this is an indication that the charge in the cell (or Vnode voltage) does not leak much. Under these circumstances, the output of the gate 310, or A, will be "high." This will set the refresh time to 32 us. If the outputs comp0-comp4 are a mixture of "highs" and "lows," then the output of gate 320, B, will be high, which selects the refresh rate in the range between 12–24us. The more "high" signals, the closer the refresh time is to 8 us. The fewer "high" signals, the closer the refresh time is to 32 us. It is assumed that the default refresh cycle time is 16 us for the existing technology of DRAM. Minor adjustment is made through the setting of outputs X, Y and Z. As the result, the refresh power can be saved.

The following table indicates that the refresh cycle time can be tailored by the output signals from the control circuit according to the degree of cell leakage. It should be noted that the refresh cycle times given in microseconds in the table are a relative number used here for illustrative purposes.

| Cell leakage condition | Output Signals from Control Circuit | Refresh Cycle time |
|---|---|---|
| Case 1: All Comp signals are "high," cell leaks significantly. | C = 1 | 8 u |
| Case 2: Mix of "high" and "low," cell leaks moderately | B = 1 | |
| Case 2A: Comp0 is "low," rest are "high." | X = Y = Z = 1 | 12 u |
| Case 2B: Comp0 and Comp1 are "low, rest are "high." | X = Y = 1, Z = 0 | 16 u |
| Case 2C: Comp0, 1 and 2 are "low," rest are "high." | X = 1, Y = Z = 0 | 20 u |
| Case 2D: Comp0, 1, 2, 3 are low, only Comp4 is "high" | X = Y = Z = 0 | 24 u |
| Case 3: All comp signals re "low." Cell does not leak much. | A = 1 | 32 u |

Figure 6:
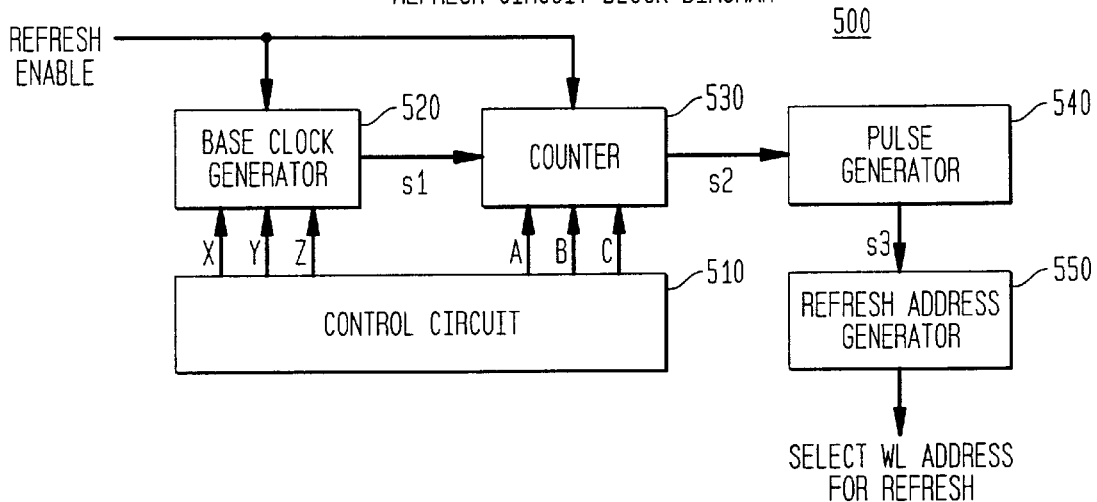
FIG. 6 illustrates the combination of a refresh circuit and a leakage monitor and control circuit that may be used in the practice of this invention.
Figure 7:
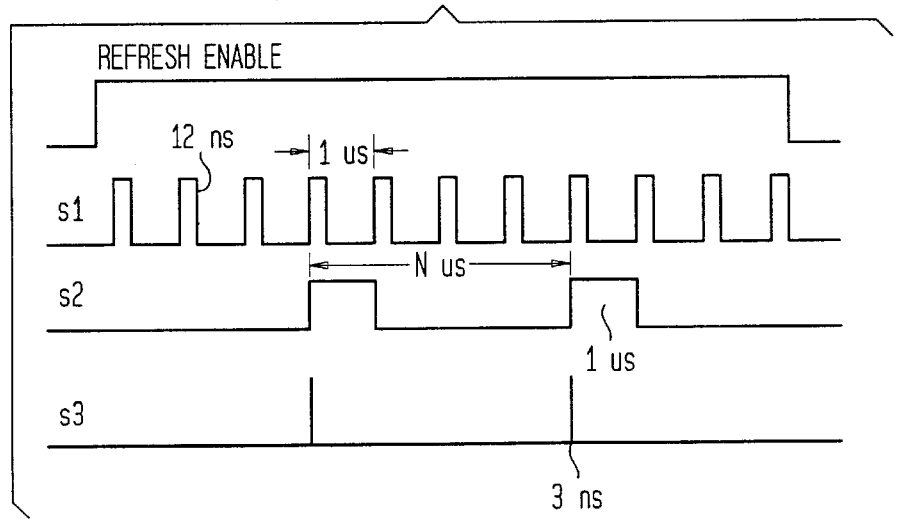
FIG. 7 shows a refresh pulse timing diagram.

FIG. 6 illustrates the combination of the refresh circuit and the leakage monitor and control circuit. The outputs X, Y and Z from the leakage monitor component 510 can be sent to a base clock generator 520 for a coarse tuning of the refresh rate. The timing diagram of the refresh circuit is shown in FIG. 7.

Figure 8:
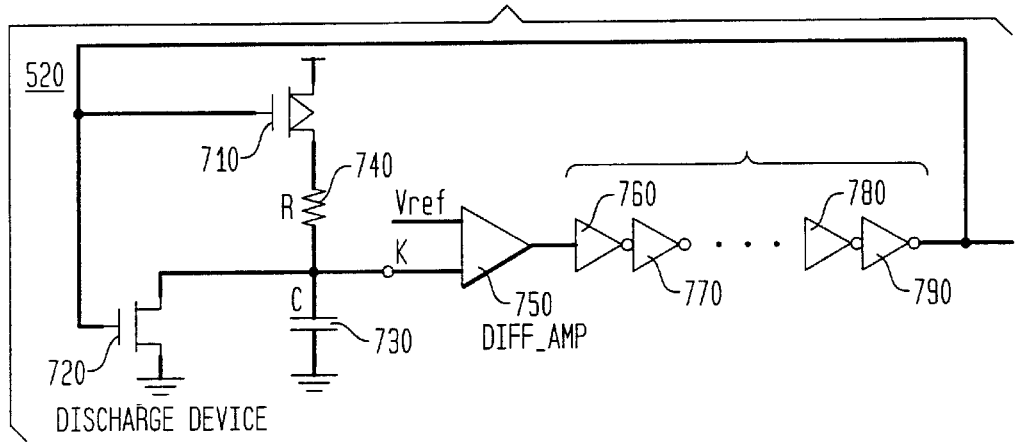
FIG. 8 is a block diagram of a base clock generator of the refresh circuit of FIG. 6.

For example, when entering the self-refresh mode, a refresh enable signal is issued to enable both the base clock generator 520 and the counter 530. A simplified circuit schematic of the base clock is shown in FIG. 8. Basically, this circuit includes an RC timer which generates a low frequency clock signal s1 with a pulse, for example, 12 ns wide and a 1 us period. The base clock generator 520, as shown in FIG. 8, comprises a pull-up pMOS device 710, a resistor component 740, an adjustable capacitor component 730, a discharge NMOS device 720, and a differential amplifier 750. Node "K" is the node in between the R and C components. A reference voltage is applied on one leg of the differential amplifier 750, and node "K" input is applied on the other leg. FIG. 8 also shows an inverter chain including several inverters, i. e, 760, 770, 780 and 790.

Figure 9:
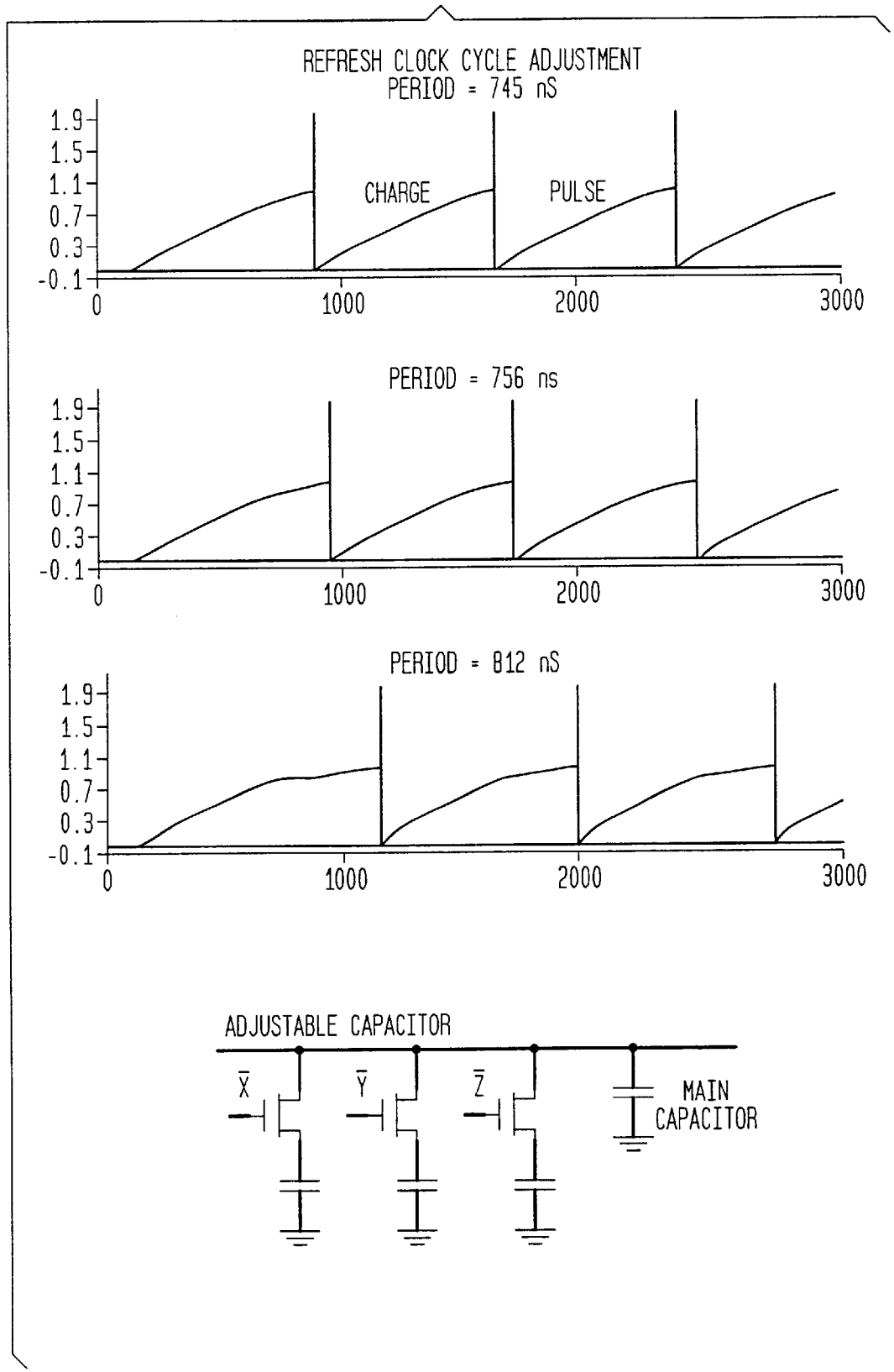
FIG. 9 illustrates various refresh cycle time adjustments made through decoding capacitor components.

The RC timer is operated in such a way that the capacitor 730 is charged up through the device 710 with an RC delay. Thus, the bigger the capacitor size, the longer the time it takes to charge up. When the voltage at node K reaches the level of the reference voltage, a signal is generated by the differential amplifier 750. After the chain inverter delay, this signal is fed back to shut off the pull up pMOS device and to discharge the voltage at node K. The RC charging delay determines the pulse distance of the base clock, and the feedback delay determines the pulse width. Therefore, the pulse period can be adjusted by adjusting the capacitive loading. As illustrated in FIG. 9, several different pulse periods can be achieved by adjusting the size of the capacitor through the three bit inputs of X, Y and Z from the monitor cell control circuit 510.

An example of adjusting the RC timer clock rate is shown in FIG. 9. Other than the main capacitor, there can be several smaller capacitors which can be switched on or off by the input pins, e.g. X, Y and Z.

With the circuit shown in FIG. 6, an eight bit counter 530 is used as a frequency divider to generate signal s2 with a typical cycle time of N us, which is a default value and can be altered by fuse programming. For example, if the default retention time of the cell is 128 ms, and an 8K refresh mode is used or each time need to refresh 8000 wordlines, then we can calculate the default N=128 ms/8K=16 us. We can use the output pins A, B and C from the refresh circuit 510 to choose a different N number. For example, if A=1, then N=32, if B=1, then N=16 (the default value), and if C=1, then N=8 so that the refresh cycle time can be changed to meet the refresh requirements. This is the coarse adjustment of the refresh rate.

A pulse generator 540 converts the s2 signal from the eight bit counter to a narrow pulse signal s3, which will be sent to refresh address generator 550 to select the refresh word-line address. Detailed pulse timing diagrams of signals s1, s2 and s3 are shown in FIG. 7.

Figure 10:
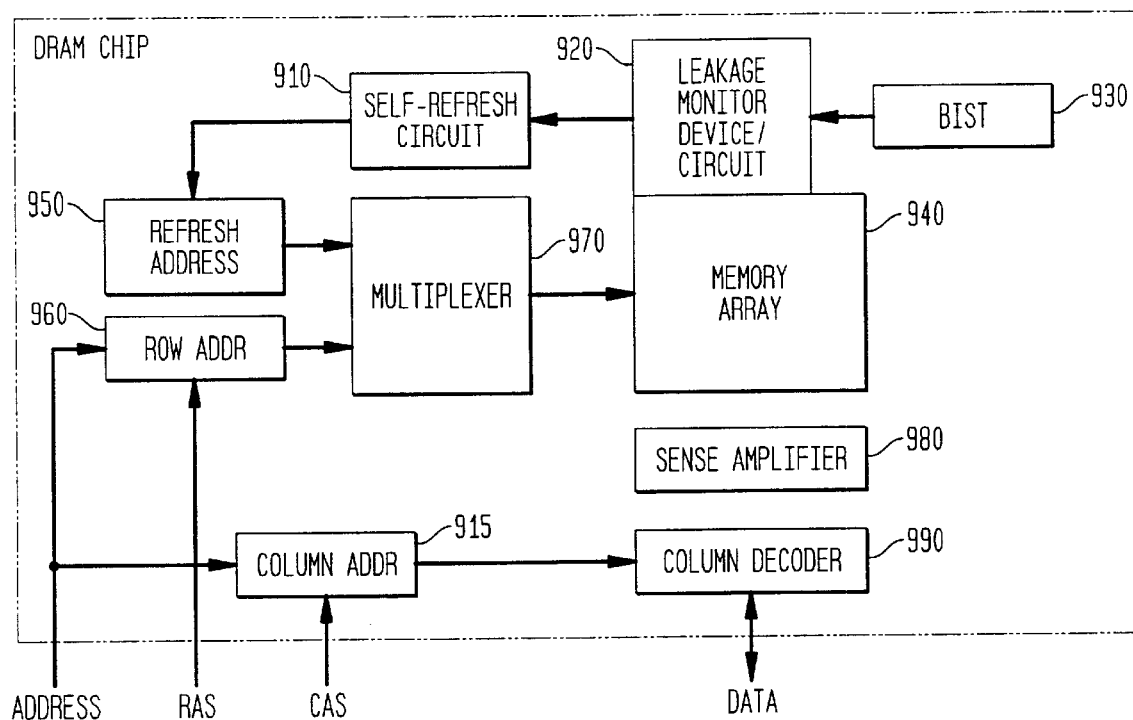
FIG. 10 shows a leakage monitor scheme embodying this invention and implemented on a stand alone DRAM chip.

FIG. 10 shows how the leakage monitor scheme may be implemented in a stand alone DRAM chip. In this embodiment, only one monitoring device and one refresh circuit component are included. A BIST engine 930 communicates with the leakage monitor and the self-refresh components. The refresh cycle time is adjusted based on the cell leakage condition. If the cell leaks more, it refreshes more frequently so the data integrity is maintained. If the cell leaks less, then the refresh rate becomes less frequent to minimize the power consumption.

Figure 11:
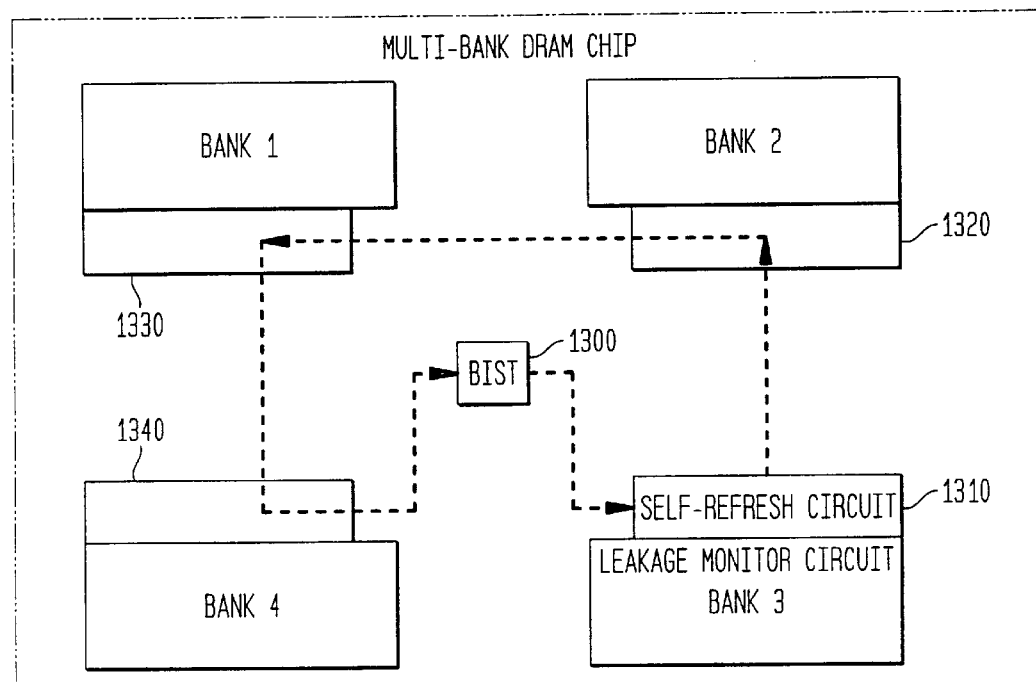
FIG. 11 shows a multi-bank DRAM architecture employing the present invention.

With reference to FIG. 11, for a large DRAM, for example 1G and greater, commonly, a mult-bank architecture is used. Here, in this embodiment of FIG. 11, each bank can have its own leakage monitor device and separated self-refresh components. With this arrangement, each bank may refresh with its own rate depending on the cell leakage condition of that bank.

Figure 12:
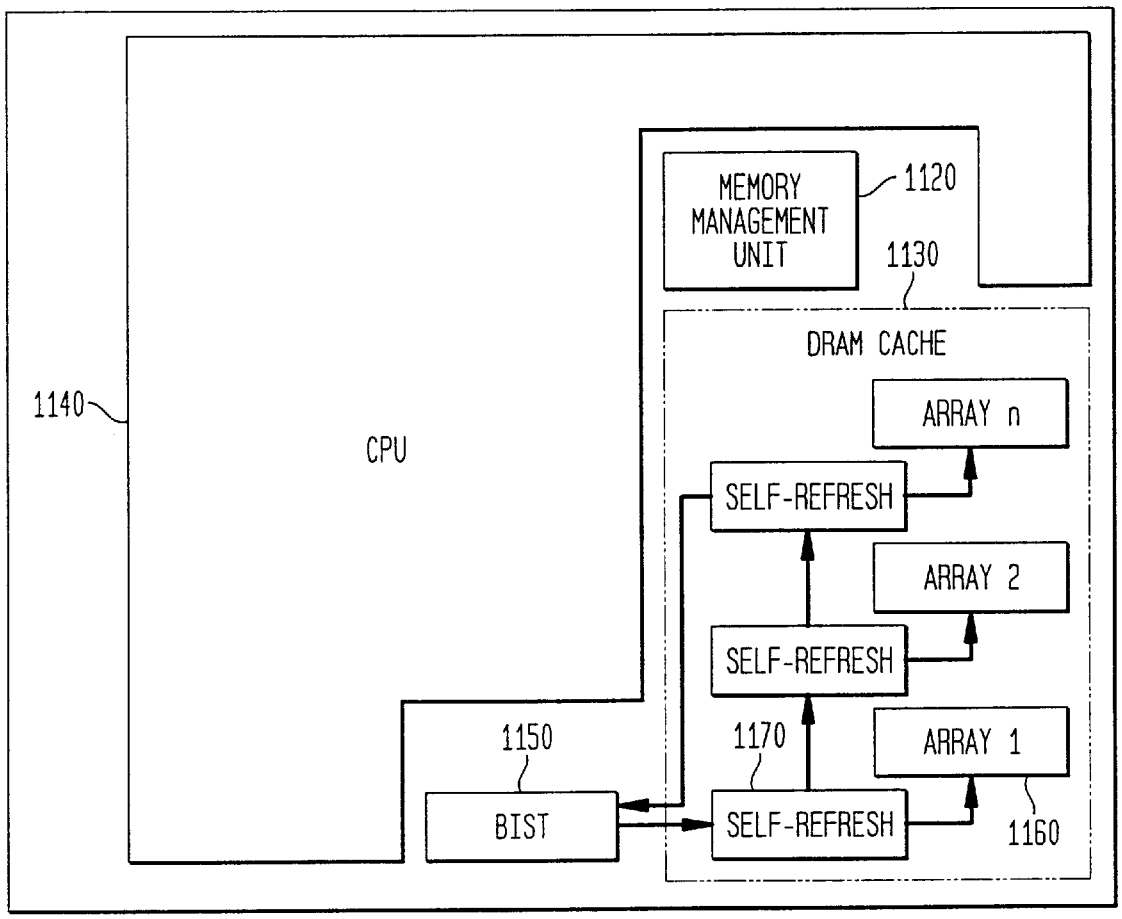
FIG. 12 illustrates an embedded DRAM cache incorporating a refresh mechanism according to this invention.

FIG. 12 illustrates an embedded DRAM cache. One or more leakage monitor devices and self-refresh circuit components can be included. A BIST refresh rate of each individual DRAM array.

Figure 13:
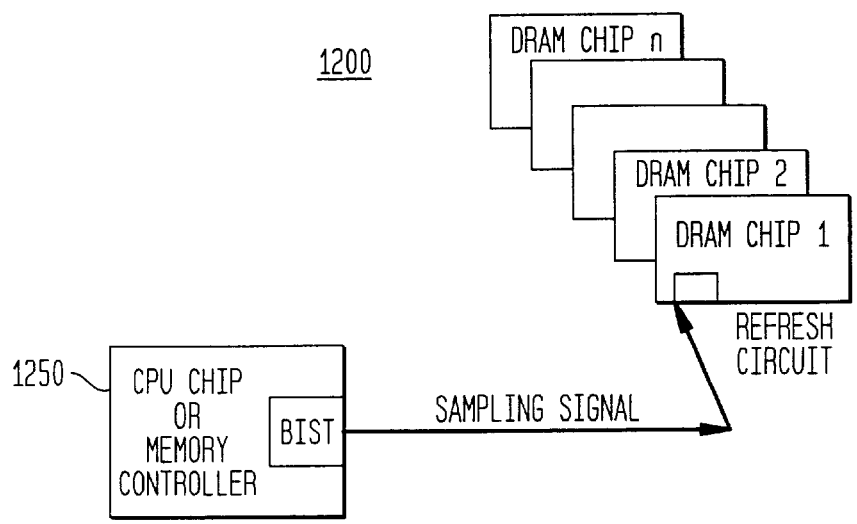
FIG. 13 illustrates several DRAM chips installed in a module.

FIG. 13 shows several DRAM chips installed in a module. Each chip may have its own leakage monitoring device and refresh circuits. A BIST engine inside a CPU chip will issue a monitor signal to each chip to evaluate the leakage level of each chip and to adjust the refresh cycle for each chip.

Figure 14:
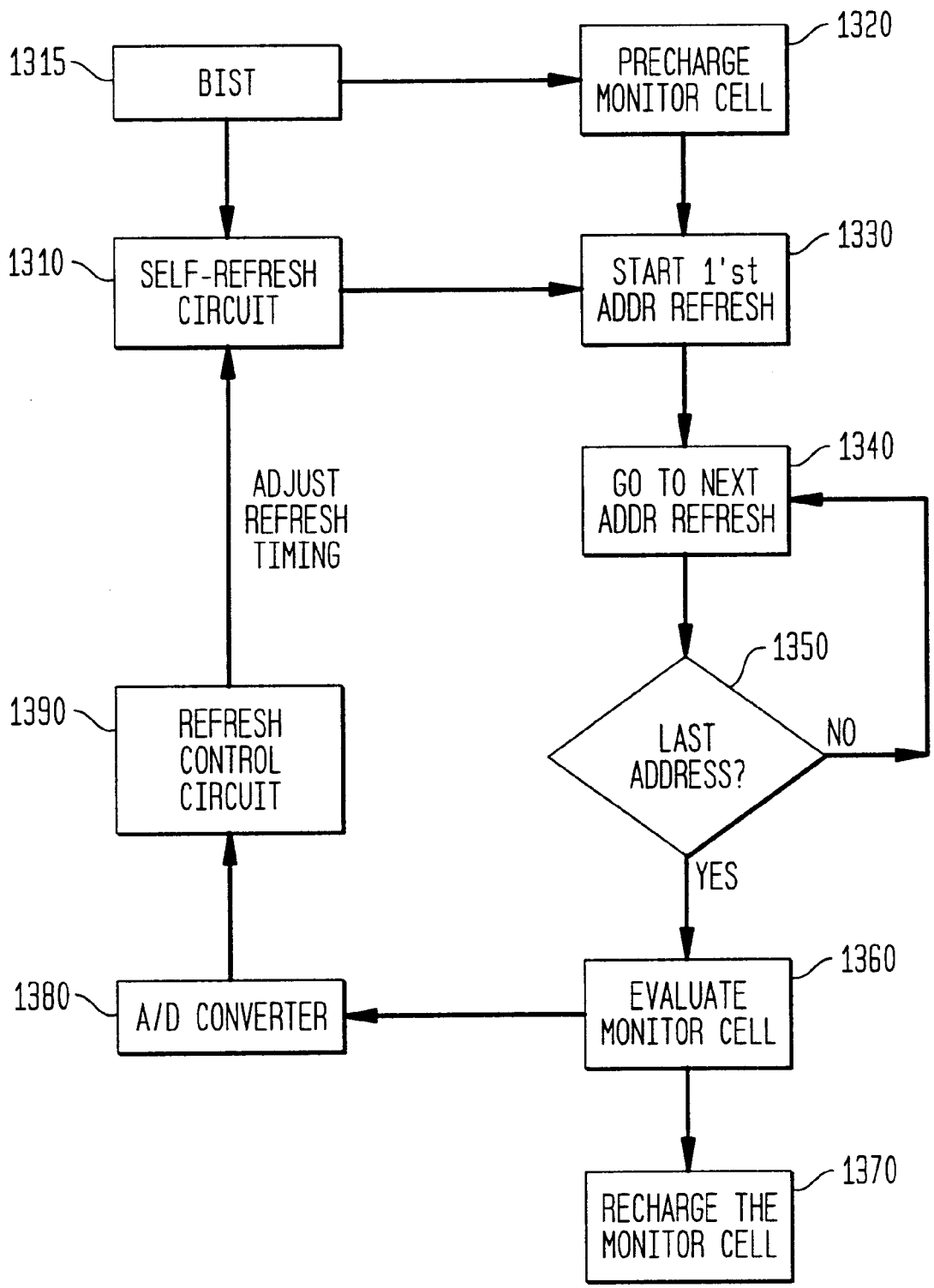
FIG. 14 is a flow chart outlining a refresh procedure embodying this invention.

FIG. 14 shows a flow char of the intelligent refresh. The operating sequence is described below.

(1) A BIST engine 1315 issues a refresh command to pre-charge the monitor cell 1320 and to activate the self-refresh circuit 1310.

(2) The self-refresh circuit 1310 starts the refresh operation from the first word-line address 1330.

(3) After refreshing the last word-line address 1350, the monitor cell is evaluated 1360.

(4) The monitor cell will be recharged after evaluation is done 1370.

(5) The result of evaluation will be used to adjust the refresh cycle time through a control circuit 1390.

(6) The new refresh cycle time will be used in the following refresh cycle from the first word-line to the last word-line, and so on.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of adjusting a dynamic DRAM refresh rate based on cell leakage monitoring, comprising:
   fabricating the DRAM with a multitude of integrated memory cells;
   directly measuring the leakage rate of at least one of the integrated memory cells; and
   adjusting a cell ref rate based on the measured leakage rate; wherein the fabricating step includes the steps of
   i) providing said at least one of the memory cells with a first, charging gate to charge said one cell, and
   ii) providing said at least one of the memory cells with a second gate for evaluating the charge stored in said one cell; and
   the directly measuring step includes the step of evaluating said one of the cells, through the second gate to identify a voltage level for said at least one of the cells.

2. A method according to claim 1 wherein:
   the evaluating step includes the step of evaluating said one of the cells, through the second gate, to apply the voltage level of said at least one of the cells to a series of voltage comparators to identify a voltage level for said at least one of the cells.

3. A method according to claim 2, wherein said at least one of the memory cells is a monitor cell or monitor cell group.

4. A method according to claim 2, wherein the adjusting step includes the step of adjusting the cell refresh rate based on the identified cell voltage level.

5. A dynamic random access memory (DRAM), comprising:

an array of memory cells integrally formed in the DRAM;
a cell leakage monitoring circuit integrally formed in the DRAM to directly measure the leakage rate of at least one of the cells of the DRAM; and
a refresh rate adjustment circuit to adjust a cell refresh rate based on the measured leakage rate; and
wherein said at least one of the cells includes a first, charging gate to charge said one cell, and a second gate for evaluating the charge stored in said at least one cell.

6. A dynamic random access memory according to claim 5, wherein:
   i) the cell leakage monitoring circuit includes
   ii) a series of voltage comparators, and
   a subcircuit to apply the voltage level of said one of the cells to the series of voltage comparators to identify a voltage level for said at least one of the cell.

7. A dynamic random access memory according to claim 6, wherein the adjustment circuit adjusts the cell refresh rate based on the identified voltage level.

8. A method for refreshing the cells of a DRAM, comprising:
   issuing a refresh command to pre-charge a monitor cell and to activate a self-refresh circuit; the self-refresh circuit starting a refresh operation from a first word-line address to a last word-line address;
   after refreshing the last word-line address, evaluating the monitor cell;
   after evaluating the monitor cell, recharging the monitor cell;
   using the result of the evaluation to adjust the refresh cycle time through a control circuit; and using the adjusted refresh cycle time in the next refresh cycle from the first word-line to the last word-line;
   wherein the step of using the result of the evaluation to adjust the refresh cycle time includes the steps of:
   generating a first set and a set of signals based on the evaluation of the monitor cell using the first set of signals to make a coarse adjustment of the refresh cycle time; and using the second set of signals to make a fine adjustment of the refresh cycle time.

9. A method according to claim 8 wherein:
   the step of using the first set of signals includes the stop of applying the first set of signals to set a counter; and
   the step of using the second set of signals includes the step of applying the second set of signals to adjust the frequency of a base clock generator.

10. A method according to claim 8, wherein the DRAM is a stand alone DRAM chip.

11. A method according to claim 8, wherein the DRAM has a multi-bank architecture.

12. A method according to claim 8, wherein the DRAM is an embedded DRAM cache.

13. A method according to claim 8, wherein the DRAM includes several DRAM chips installed in a module.

* * * * *